United States Patent [19]

Bergles et al.

[11] Patent Number: 4,741,385
[45] Date of Patent: May 3, 1988

[54] GAS JET IMPINGEMENT MEANS AND METHOD

[75] Inventors: Arthur E. Bergles, Ames, Iowa; Chung Ma Fang, Beijing, China

[73] Assignee: Iowa State University Research Foundation, Inc., Ames, Iowa

[21] Appl. No.: 88,004

[22] Filed: Aug. 18, 1987

Related U.S. Application Data

[63] Continuation of Ser. No. 830,279, Feb. 18, 1986, abandoned.

[51] Int. Cl.$^4$ ............................................. H01L 23/44
[52] U.S. Cl. ................................. 165/1; 165/104.29; 165/104.33; 165/908; 324/158 F; 374/45
[58] Field of Search ............... 165/104.33, 104.29, 165/911, 908, 1; 324/158 F; 374/45

[56] References Cited

U.S. PATENT DOCUMENTS

| | | |
|---|---|---|
| 3,321,953 | 5/1967 | Roveti . |
| 3,710,251 | 1/1973 | Hagge et al. . |
| 3,725,566 | 4/1973 | Plizak ............................... 165/911 |
| 3,807,216 | 4/1974 | Lindwedel et al. . |
| 3,979,671 | 9/1976 | Meeker et al. . |
| 4,172,993 | 10/1979 | Leach . |
| 4,203,129 | 5/1980 | Oktay et al. ........................ 165/908 |
| 4,324,285 | 4/1982 | Henderson . |

FOREIGN PATENT DOCUMENTS 594446 2/1978 U.S.S.R. ............................ 374/45

Primary Examiner—Albert W. Davis, Jr.
Attorney, Agent, or Firm—Zarley, McKee, Thomte, Voorhees & Sease

[57] ABSTRACT

A means and method for cooling enhancement of microelectric devices tested at high power levels in a liquid bath by gas jet impingement, the means including a substrate means for positioning a microelectric device within a liquid cooling bath and means for supplying testing power from a power source to the microelectric devices, and a gas jet means for impinging a gaseous flow upon the microelectric device while positioned on said substrate means. The method includes securing the microelectric devices upon the substrate means, which is in turn submersed in the liquid coolant bath. a gas jet is impinged upon the microelectric devices and testing power supplied thereto.

15 Claims, 1 Drawing Sheet

GAS JET IMPINGEMENT MEANS AND METHOD

This is a continuation of co-pending application Ser. No. 830,279 filed on 2-18-86 now abandoned.

BACKGROUND OF THE INVENTION

1. Field of the Invention

This invention relates to a means and methods for cooling microelectric devices being tested at high power levels, and in particular, to means and methods for cooling enhancement of microelectric devices tested at high power levels in a liquid bath.

2. Problems in the Art

Microelectric devices are required to be manufactured with high precision and great durability. Quality control requires that the microelectric devices be tested over and beyond their required power-handling range to insure operability and durability. High power testing produces high temperatures.

It is crucial that the microelectric devices be kept within a certain predetermined temperature range during testing. If allowed to surpass that limit, there is danger that damage will occur to the device.

Various attempts have been made to maintain this temperature limit in microelectric devices while being tested. These include conduction to air cooled or water cooled cold plates.

Another method simply immerses the microelectric device being tested in a dielectric coolant. The mode of heat transfer may be face convection or nucleate pool boiling. Other methods circulate or cause the coolant to flow around the microelectric devices.

Although all of these methods are adequate under certain conditions, problems still exist in maintaining the temperature within the necessary range when the microelectric devices are tested at high power levels. Improvement is still needed in minimizing the increase in microelectric device temperature while being so tested, because an excessive increase in temperature alters the characteristics of the device.

Additionally, many of the present methods for cooling require complex structure at the device and an involved coolant circulation system.

It is therefore an object of this invention to provide a gas jet impingement means and method for cooling enhancement of microelectric devices tested at high power levels in a liquid bath.

It is a further object of this invention to provide a gas jet impingement means and method which will enhance heat transfer so that high microelectric device powers can be accommodated with modest increases in microelectric device temperature.

A further object of this invention is to provide a gas jet impingement means and method which promotes enhanced cooling by agitation of the coolant, induced coolant flow, and evaporative cooling of the coolant near the microelectric device.

Another object of this invention is to provide a gas jet impingement means and method which allows higher microelectric device powers to be accommodated within a prescribed microelectric device temperature limit.

Another object of this invention is to provide a gas jet impingement means and method which has a significant improvement in heat transfer performance.

A further object of this invention is to provide a gas jet impingement means and method which is directed immediately upon a microelectric device, but also affects surrounding miroelectric devices.

Another object of this invention is to provide a gas jet impingement means and method which can provide cooling enhancement of a plurality of microelectric devices simultaneously.

A further object of this invention is to provide a gas jet impingement means and method which is simple in structure and operation, efficient and durable.

A further object of this invention is to provide a gas jet impingement means and method which can be easily adapted to different cooling situations.

These and other features, objects, and advantages will become apparent with reference to the accompanying specification and claims.

SUMMARY OF THE INVENTION

This invention utilizes a gas jet which is directly impinged upon microelectric devices which are submersed in a dielectric coolant and being tested at high power levels. The microelectric devices are positioned upon a substrate and lowered into the coolant. A conduit for the gas is positionable so that the gas jet impinges directly upon selected microelectric devices. The gas jet impingement promotes enhanced cooling by agitation of the liquid, induced liquid flow, and evaporative cooling of the liquid near the microelectric device. Additionally, multiple jets can be utilized to enhance the cooling of a plurality of microelectric devices simultaneously.

DETAILED DESCRIPTION OF THE PREFERRED EMBODIMENT

Figure 1:
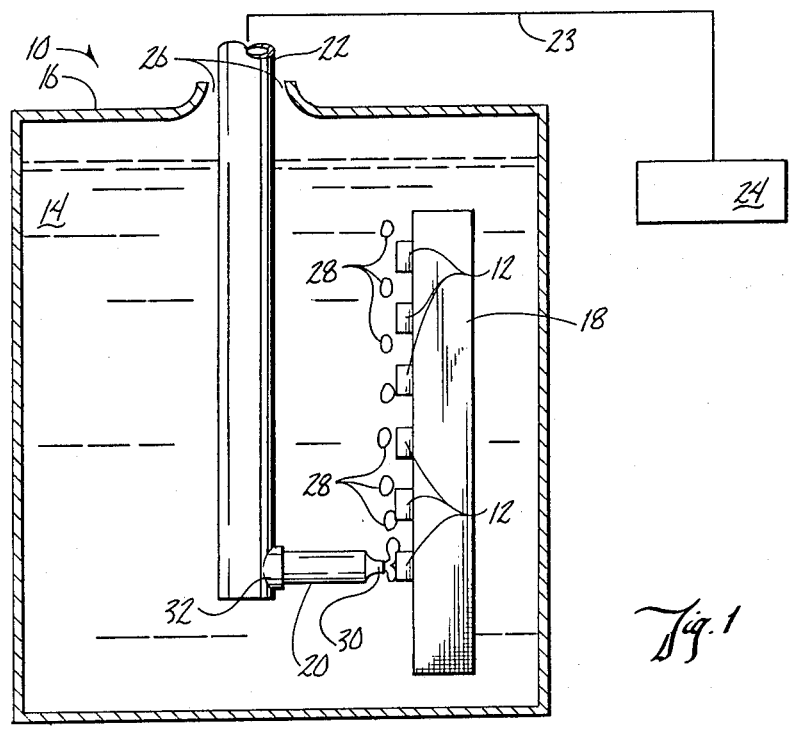
FIG. 1 is a front sectional view of the invention.

In reference to the drawings, and particularly FIG. 1, there is shown a gas jet impingement means 10 for cooling enhancement of microelectric devices 12 tested at high power levels in a liquid coolant bath 14.

In the preferred embodiment depicted in FIG. 1, a container 16 holds coolant 14. A substrate means 18 is positionable within the coolant 14 of container 16. Microelectric devices 12 are operatively mounted on substrate means 18 in the spaced relation illustrated in FIG. 1.

Substrate means 18 includes structure which allows power from a power source (not shown) to be operatively and selectively connected to microelectric devices 12. These connections are known in the art.

A gas jet nozzle 20 is connected to a gas conduit 22 which extends outwardly from an opening in the top of container 16. As shown in FIG. 1 schematically, gas conduit 22 is connected in fluid communication to a pressurized gas source 24. The gas supply can be maintained at room temperature.

Gas jet nozzle 20 is adjustably positionable so that it can be directly adjacent to selected microelectric devices 12. This can be accomplished by securing the gas jet conduit to an adjustment means (not shown).

It will be noted that container 16, in the preferred embodiment, has a gas outlet 26 surrounding gas conduit 22 to allow pressurized gas (denoted by bubbles and referenced by numeral 28) to escape from the container.

Gas jet nozzle 20 must be positioned so that the gas jet issuing from it will directly impinge upon a selected microelectric device 12. The effect of the gas jet impingement is greatest upon the microelectric device 12 which it is directly aimed at, but it is to be noted that the surrounding microelectric devices 12 are also advantageously affected. In order to get the best cooling performance, the nozzle 20 should be positioned very close to the selected microelectric device 12 and aimed at the point which is a little lower than the center of device 12.

Gas jet nozzle 20 can be made of any sufficient materials having a passagway for the channeling of pressurized gas 28. It is best to have a tip 30 having a narrower in diameter central channel so that the pressurized gas 28 forms a jet stream when it issues therefrom.

Gas conduit 22 can be of any sufficient material having a channel extending therethrough and having means for connection to gas jet nozzle 20. This means can simply be a female receptor 32 which would form an air tight seal between gas jet nozzle 20 and gas conduit 22.

The pressurized gas source 24 can simply be a container of high pressure gas which is in fluid communication (shown schematically by line 23) with gas conduit 22. The high pressure gas can be nitrogen or some other inert gas. The structure and method for delivering pressurized gas to the gas conduit is known in the art.

Bath or coolant 14, in the preferred embodiment, is a dielectric coolant known in the art. The coolant is conditioned (decontaminated and cooled) by standard procedures.

Figure 2:
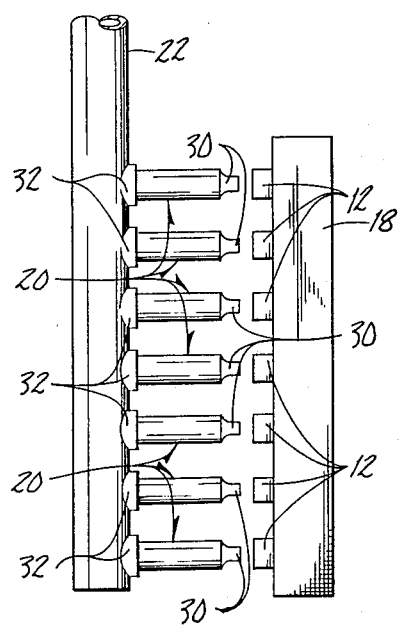
FIG. 2 is an alternative embodiment of the invention of FIG. 1.

In reference to FIG. 2, it can be seen that an alternative embodiment of the invention can include multiple gas jet nozzles 20, each being positioned and aligned so that pressurized gas exiting from the plurality of gas jet nozzles 20 will directly impinge on a corresponding microelectric device 12 simultaneously. Thus, the advantageous cooling enhancement of the gas jets is available for simultaneous high power testing of a plurality of microelectric devices 12.

Figure 3:
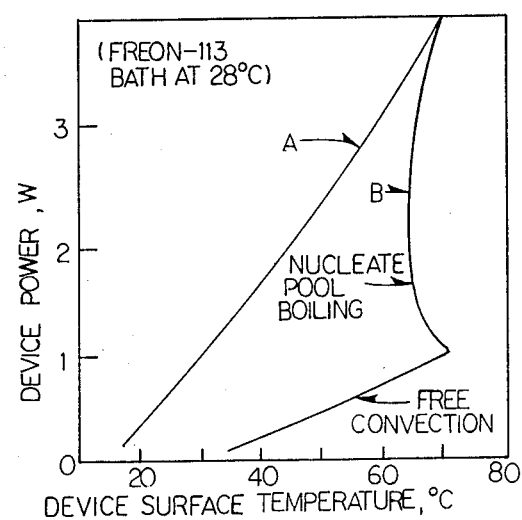
FIG. 3 is a graph showing the increased cooling enhancement of the invention.

FIG. 3 is a graph which illustrates the advantageous properties of the invention 10. The vertical axis sets forth the power range over which simulated microelectric devices 12 were tested, namely zero to four watts. The horizontal axis depicts the temperature of the heater from 0° to 80° C. As noted, the bath or coolant 14 is at 28° C. Also, the pressurized gas 28 is impinged upon the microelectric device(s) 12 being tested at 6.7 meters per second. Graph line A represents the plot of temperature versus power using the gas jet impingement invention 10. Plot B represents temperature versus power for a heater 12 tested in a liquid bath 14 without the gas jet impingement. The temperature of microelectric devices 12 using gas jet impingement was lower throughout the testing range; more than 30° C. at one watt of power. It is also noted that evaporative cooling caused by the gas jet impingement results in the microelectric device 12 being below the pool temperature at lower powers. The result is that higher microelectric device powers can be accommodated within a prescribed temperature limit.

In operation, the invention functions as described above. Simply, the microelectric devices 12 are mounted upon substrate means 18 which facilitates their operative connection to a power source. The means and manner of operative connection to a power source are known in the art and are not within the scope of this invention.

The substrate means with the microelectric device(s) 12 being mounted thereon is submersed into the bath or coolant 14 inside container 16. Gas jet nozzle 20 is the positioned so that gas jet 28 directly impinges upon a selected microelectric device 12. Power is then supplied to that microelectric device 12 for testing, and the gas jet 28 enhances the cooling around microelectric device 12, keeping it within prescribed temperature limits during testing.

When the next microelectric device 12 is tested, the gas jet nozzle 20 can be positioned for optimal cooling enhancement by gas jet impingement.

Alternatively, all microelectric devices 12 could be tested simultaneously by using the embodiment shown in FIG. 2, wherein each microelectric device has a gas jet nozzle directly impinging a gas jet upon it.

The included preferred embodiment is given by way of example only, and not by way of limitation to the invention, which is solely described by the claims herein. Variations obvious to one skilled in the art will be included within the invention defined by the claims.

What is claimed is:

1. A gas jet impingement means for cooling enhancement of microelectric devices tested in a liquid bath at high power levels while being operatively connected to a power source, comprising:
    a container means holding a liquid bath;
    a substrate means for holding and positioning one or more microelectric devices, said substrate means being positionable in a liquid bath through an opening in said container, each microelectric device being interchangeably mounted on the substrate means so that a variety of microelectric devices can be tested;
    a means for supplying testing power from said power sources to each microelectric device; and
    an adjustable gas jet means for impinging a gaseous flow upon the microelectric devices while positioned on said substrate means, said gas jet means being secured to an adjustment means for moveably varying the position of said gas jet means with respect to each microelectric device so that said gas jet nozzle means can be selectively positioned in close proximity to any selected microelectric device.

2. The device of claim 1 wherein said gas jet means comprises a nozzle means submersed in said liquid bath adjacent to said microelectric devices and being connected in fluid communication to a pressurized gas source.

3. The device of claim 1 wherein said liquid bath is comprised of dielectric coolant.

4. The device of claim 2 further comprising an enclosed container means holding said liquid bath and having an aperture in its top through which extends a conduit means from said pressurized gas source to said nozzle means and through which gas which has risen to the top of said liquid bath escapes from said container.

5. The device of claim 2 further comprising an enclosed container means holding said liquid bath and having a first aperture in its top through which extends a conduit means from said pressurized gas source to said nozzle means, and a second aperture in the top of said container through which gas which has risen to the top of said liquid bath escapes from said container.

6. The device of claim 1 wherein said gaseous flow is comprised of a pressurized inert gas.

7. A gas jet impingement means for cooling enhancement of microelectric computer chips immersed in a dielectric coolant and being tested at high power levels, said chips being adjustably secured and positioned by a substrate means within said coolant and having electric power means selectively operatively connected thereto, comprising:

an adjustable nozzle means connected in fluid communication with a pressurized gas source and being adjustably positionable with respect to said chips so that the pressurized gas from said pressurized gas source can be directed upon said chips.

8. The device of claim 7 wherein said gas jet impingement means further comprises a conduit means between said pressurized gas source and said nozzle means.

9. The device of claim 8 wherein said gas jet impingement means further comprises a container for said coolant with means for escape of said pressurized gas from said coolant.

10. The device of claim 7 wherein said gas jet impingement means further comprises a plurality of nozzle means, each positionable adjacent said chips.

11. A method for cooling enhancement of microelectric devices tested at high power levels in a liquid bath, comprising:

submersing said microelectric devices positioned on a substrate into a liquid bath;

operatively connecting said microelectric devices to a source of electrical power;

adjustably positioning a gas jet adjacent to a selected microelectric device; and impinging a gas jet upon a selected microelectric device.

12. The method of claim 11 further comprising the steps of securing said microelectric devices to a substrate means for holding and positioning the microelectric devices, submersing said microelectric devices into a liquid cooling bath, and supplying testing to the microelectric devices.

13. The method of claim 11 wherein a gas jet is impinged directly upon each and every microelectric device.

14. The device of claim 1 further comprising a plurality of gas jet means each for impinging a gaseous flow directly upon a different microelectric device.

15. The method of claim 11 further comprising positioning a plurality of gas jets, each adjacent to a different microelectric device.

* * * * *